United States Patent
Yamaguchi et al.

(10) Patent No.: US 6,955,739 B2
(45) Date of Patent: Oct. 18, 2005

(54) METHOD FOR ADHERING SUBSTRATES USING ULTRAVIOLET ACTIVATABLE ADHESIVE FILM AND AN ULTRAVIOLET IRRADIATION APPARATUS

(75) Inventors: Hiroaki Yamaguchi, Hachioji (JP); Tetsu Kitamura, Kawasaki (JP)

(73) Assignee: 3M Innovative Properties Company, St. Paul, MN (US)

( * ) Notice: Subject to any disclaimer, the term of this patent is extended or adjusted under 35 U.S.C. 154(b) by 120 days.

(21) Appl. No.: 10/480,218

(22) PCT Filed: May 24, 2002

(86) PCT No.: PCT/US02/16506

§ 371 (c)(1),
(2), (4) Date: Dec. 10, 2003

(87) PCT Pub. No.: WO02/102911

PCT Pub. Date: Dec. 27, 2002

(65) Prior Publication Data

US 2004/0159391 A1 Aug. 19, 2004

(30) Foreign Application Priority Data

Jun. 19, 2001 (JP) ........................................ 2001-185399

(51) Int. Cl.[7] .......................... B32B 27/04; B32B 27/38; B32B 31/12; C09J 163/00; C09J 163/02
(52) U.S. Cl. ............................... 156/273.3; 250/492.1; 250/492.2; 250/493.1; 250/496.1; 523/427; 523/434; 523/458; 523/459; 525/92 H; 525/481; 525/486; 525/524
(58) Field of Search ................... 156/273.3; 250/492.1, 250/492.2, 493.1, 496.1; 427/470, 493, 516; 523/427, 434, 458, 459; 525/92 H, 481, 486, 524

(56) References Cited

U.S. PATENT DOCUMENTS

| 5,494,943 | A | * | 2/1996 | Mahoney et al. .............. 522/66 |
| 5,785,793 | A | | 7/1998 | Arai et al. ................ 156/272.2 |
| 6,103,039 | A | * | 8/2000 | Paulus et al. ............... 156/223 |
| 6,294,270 | B1 | * | 9/2001 | Clough ....................... 428/620 |
| 6,309,502 | B1 | | 10/2001 | Hiroshige et al. ........ 156/273.3 |
| 6,565,927 | B1 | * | 5/2003 | Drzal et al. ................. 427/487 |
| 6,699,351 | B2 | * | 3/2004 | Yamaguchi et al. ..... 156/275.7 |

FOREIGN PATENT DOCUMENTS

| JP | 04-150974 A | 5/1992 | |
| JP | 08-146436 | 6/1996 | |
| JP | 08146436 A | * 6/1996 | ......... G02F/1/1339 |
| JP | 10-218470 | 8/1998 | |
| JP | 11-181391 A | 7/1999 | |
| JP | 2000290619 A | * 10/2000 | .......... C09J/121/00 |
| JP | 2001-007128 A | 1/2001 | |
| WO | WO 00/00566 A | 1/2000 | |
| WO | WO 02/061010 A2 | 8/2002 | |

* cited by examiner

Primary Examiner—Robert Sellers

(57) ABSTRACT

The invention provides a method for adhering two substrates comprising: providing an adhesive film having a first surface and a second surface; irradiating the adhesive film with ultraviolet radiation to provide an activated adhesive film having a first activated surface and a second activated surface; cooling the activated adhesive film either while irradiating or immediately after irradiating the film; contacting the first activated surface with a first substrate; contacting the second activated surface with a second substrate; and applying heat and pressure to the first and second substrates to cure the activated adhesive film and to bond the substrates to one another.

5 Claims, 4 Drawing Sheets

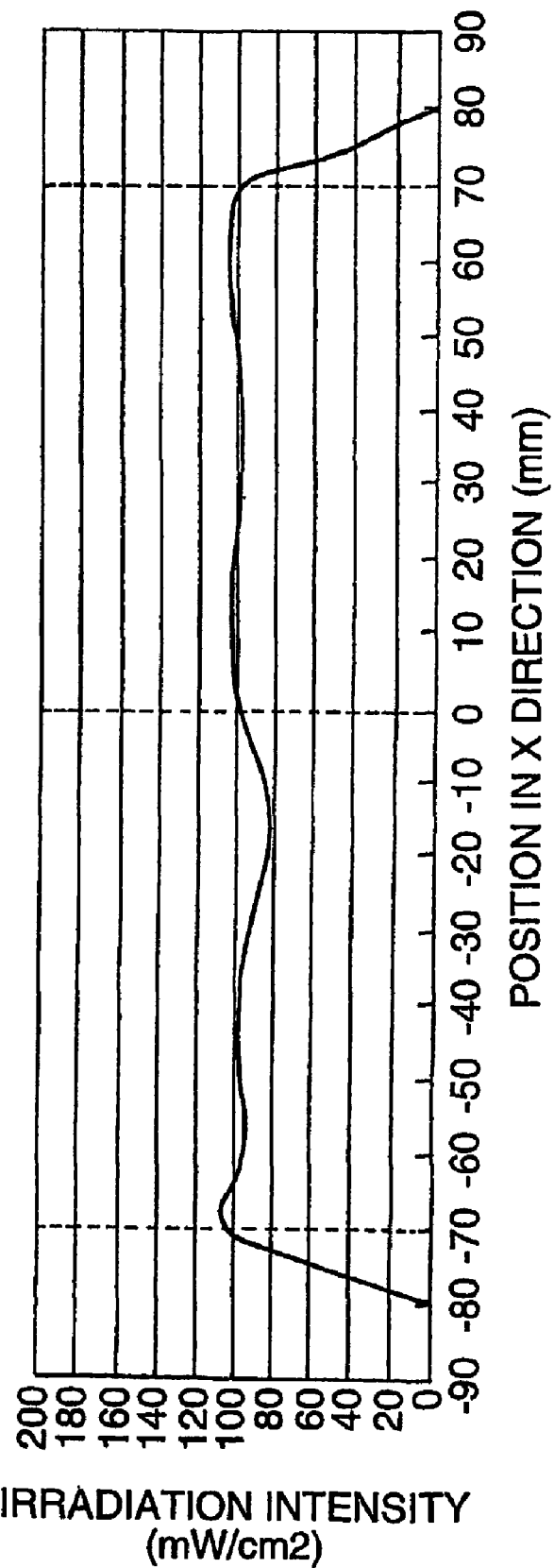

METHOD FOR ADHERING SUBSTRATES USING ULTRAVIOLET ACTIVATABLE ADHESIVE FILM AND AN ULTRAVIOLET IRRADIATION APPARATUS

The present invention relates to a method for adhering substrates using an ultraviolet activatable adhesive film, and an ultraviolet irradiation apparatus used in this method for adhering substrates.

In a liquid crystal display device, a glass-made display panel serves as the electrode and is connected to a flexible circuit called a tape carrier package ("TCP") by an anisotropically conductive adhesive film. The TCP has mounted thereon a driving integrated circuit (IC) for actuating the display panel. Usually, this conductive adhesive film is obtained from a dispersion of conductive particles in an insulating adhesive such as an epoxy resin. The adhesive film is interposed between two opposing circuits and then heated while applying pressure to complete the bonding. The bonded product comprises electrically conductive particles bonded between the connecting terminals of two opposing circuits. The placement of the conductive particles within the adhesive film enables electrical current to flow between the opposing connecting terminals.

To reduce the cost and weight of liquid crystal panels, liquid crystal panels have been developed that utilize a plastic substrate or flexible circuit using a PET film substrate. Conventional conductive adhesive films have required compression bonding temperatures as high as 150 to 200° C. However, liquid crystal panels or flexible circuits bonded at such a high temperatures can experience thermal damage such as deformation of the electrode or cracking of the display panel with accompanying connection failure. Additionally, the connection pitch between the display panel electrode and the flexible circuit is usually from 100 to 200 µm. But, the trend has been to require displays of higher precision, requiring a connection pitch of 50 µm or less. On problem associated with such a finer connection pitch is that the electrode of the flexible circuit deforms due to the heat generated by the thermal compression bonding of the adhesive film and causes shifting of the electrode pattern of the display panel.

In order to solve these problems, the art has used ultraviolet (UV) activated anisotropically conductive adhesive films capable of thermal compression bonding at a lower temperature, and methods of connecting the circuits using this adhesive film.

Japanese Unexamined Patent Publication (Kokai) No. 11-60899 describes a method for electrically connecting the conductors, where the circuits are connected using a UV-activated anisotropically conductive adhesive film through the steps of disposing the UV-activated anisotropically conductive adhesive film on a first circuit substrate, irradiating ultraviolet rays on an adhesive film using a high-pressure mercury lamp, aligning the electrode of a second circuit substrate to face the electrode of the first circuit substrate, and bonding them under heat and pressure.

Japanese Unexamined Patent Publication (Kokai) No. 8-146436 describes a method for laminating a liquid crystal panel, comprising bonding a transparent substrate to another transparent substrate using a UV curable adhesive. The UV curable adhesive is interposed between transparent substrates and is then irradiated from the transparent substrate side, ultraviolet rays are irradiated to cure the adhesive. In this method, ultraviolet rays at a wavelength of 300 nm or less are blocked and thereby the transparent substrates are prevented from deteriorating.

Japanese Unexamined Patent Publication (Kokai) No. 9-320131 describes a method of bonding two disks, each disk comprising an ultraviolet transmissive substrate, using an UV-curable adhesive. The UV-curable adhesive is interposed between the two transmissive substrates and the UV curable adhesive is irradiated through the substrates using UV radiation to cure the adhesive. In this method, quartz-based glass capable of absorbing light at a wavelength of 2 to 3 µm or more is used as a filter to attenuate infrared rays. Alternatively, cooled air is passed through the filter and the UV lamp so that the substrate can be prevented from receiving the effect of the secondary radiation heat from the filter.

While the use of an UV-activated adhesive enables bonding by thermal compression at lower temperatures in a short time, an increase in the intensity of ultraviolet light sources has further provided even shorter bonding times. Therefore, a higher intensity UV-light source such as a high-pressure mercury lamp and/or a metal halide lamp will shorten the bonding times even further. In conventional methods, however, ultraviolet rays are irradiated after an ultraviolet curable adhesive is disposed on a substrate, and if the adhesive is cured using the above-described high-pressure mercury lamp or metal halide lamp as a light source, the ultraviolet rays are also irradiated on the transparent substrate of the liquid crystal panel. Depending on the material of the transparent substrate, the transparent substrate may deteriorate such as by becoming discolored or clouded. In the case of a resin-made substrate, the material may decompose and cracks may be generated thereon.

Furthermore, upon irradiation of ultraviolet rays on a substrate, the substrate will heat due to the energy of the ultraviolet rays But depending on the material, the substrate has a high coefficient of thermal expansion and even with a small elevation of the temperature, the substrate thermally expands to generate shifting between the two substrates during the bonding and curing and as a result, connection failure may occur.

The inventor of the present invention has also proposed a method of adhering substrates in a manner that prevents deterioration of the substrates by using an UV-activated adhesive film but without irradiating the substrate, and especially a circuit substrate. According to this method, two substrates are adhered, with the UV activated adhesive film being transferred to and disposed on a substrate only after first being activated by exposure to UV radiation. Once applied to the substrate, the adhesive is thermal compression bonded. Because the substrate is not exposed to ultraviolet light, the deterioration of the substrate is prevented.

Japanese Unexamined Patent Publication (Kokai) No. 10-218470, describes a tape dispenser that is used to cut curable adhesive tape, in which curing of the adhesive progresses by photocationic polymerization after the tape is applied to a substrate. The dispenser makes it possible to limit the level of UV exposure seen by the tape so that the tape can remain at a work site outdoors, for example, without prematurely curing. If this type of UV activated adhesive film is irradiated with ultraviolet rays of excessively low intensity, the reaction system will not be activated, and the adhesive strength following thermal compression bonding will be low with the adhesive unable to adequately bond the substrate. Conversely, if the ultraviolet ray intensity is too high, the adhesive film ends up curing before being disposed on a substrate due to the heat generated within the adhesive film and separator and caused by exposure to high intensity radiation UV light. This again prevents the film from adequately adhering to the substrate.

In addition, if the ultraviolet ray intensity is not uniform, differences in the degree of curing can occur across the adhesive which, again, prevents the adhesive from adequately bonding.

It is desirable to provide a method of adhering substrates to one another using a UV activated adhesive having a relatively long useful time. It is also desirable to provide an ultraviolet irradiation apparatus that uses this method to secure an adequate usable time for the adhesive by preventing deterioration of the substrate by not allowing the substrate to be adhered to be irradiated with ultraviolet rays, and by preventing premature curing of the adhesive film by radiation heat of ultraviolet rays.

The invention provides a method for adhering two substrates comprising:

Providing an adhesive film having a first surface and a second surface;

Irradiating the adhesive film with ultraviolet radiation to provide an activated adhesive film having a first activated surface and a second activated surface;

Cooling the activated adhesive film either while irradiating or immediately after irradiating the film;

Contacting the first activated surface with a first substrate;

Contacting the second activated surface with a second substrate; and

Applying heat and pressure to the first and second substrates to cure the activated adhesive film and bond the substrates to one another.

Additionally, the present invention provides an ultraviolet irradiation apparatus used in the above substrate adhesion method is provided that is equipped with an ultraviolet irradiation head and a means for cooling the ultraviolet irradiated adhesive film.

BRIEF DESCRIPTION OF THE DRAWINGS

In describing the preferred embodiment of the invention, reference is made to the various Figures wherein various reference numerals are used to identify the described structures and wherein:

FIG. 4 is a graph showing the ultraviolet ray intensity on the surface of an adhesive film when irradiated with ultraviolet rays using the ultraviolet irradiation apparatus of the present invention.

Figure 1:
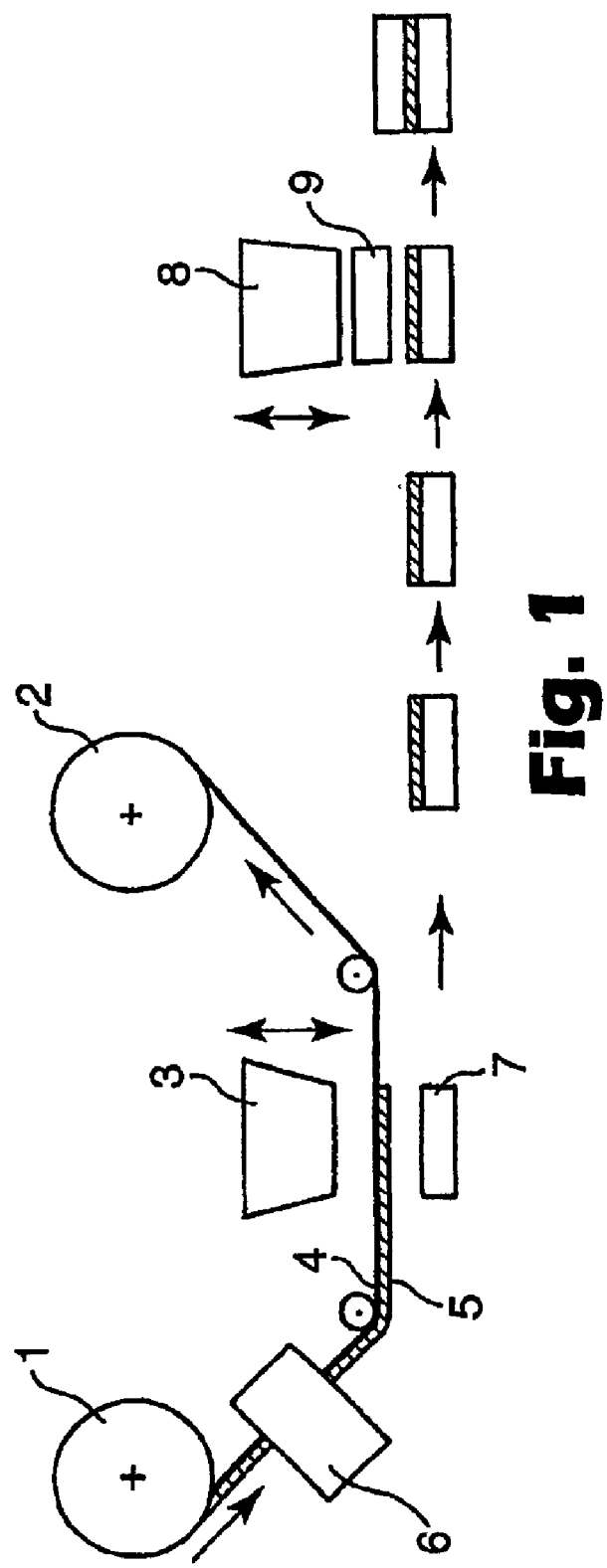
FIG. 1 is a sketch showing the process of the present invention.

One embodiment of the present invention is shown in FIG. 1. A ultraviolet activatable adhesive film 5 with a separator or backing 4 is unwound and delivered from a reel 1 and then conveyed toward a press-bonding head 3. Before reaching the press-bonding head 3, the ultraviolet activatable adhesive film 5 is transferred to a first substrate 7. Thereafter, the separator 4 is taken up by a reel 2. The substrate 7 and the adhesive film 5 is conveyed toward a press-bonding head 8 where a second substrate 9 is heat-pressed and bonded to the substrate 7 by the press-bonding head 8.

In conventional methods, ultraviolet rays were irradiated using a high-pressure mercury lamp, a metal halide lamp or a mercury xenon lamp or the like. As was previously mentioned, since adequate adhesive strength is not obtained if the intensity of the irradiated ultraviolet rays is excessively low as a result of the reaction system not being activated, it is necessary that this ultraviolet irradiation apparatus sufficiently radiate ultraviolet rays. In the case of direct irradiation using a mercury lamp and so forth, however, there was the problem of the generation of radiation heat causing the premature progression of the curing step. Therefore, in the present invention, premature curing by generation of radiation heat is prevented by cooling the adhesive film irradiated with ultraviolet rays.

Figure 2:
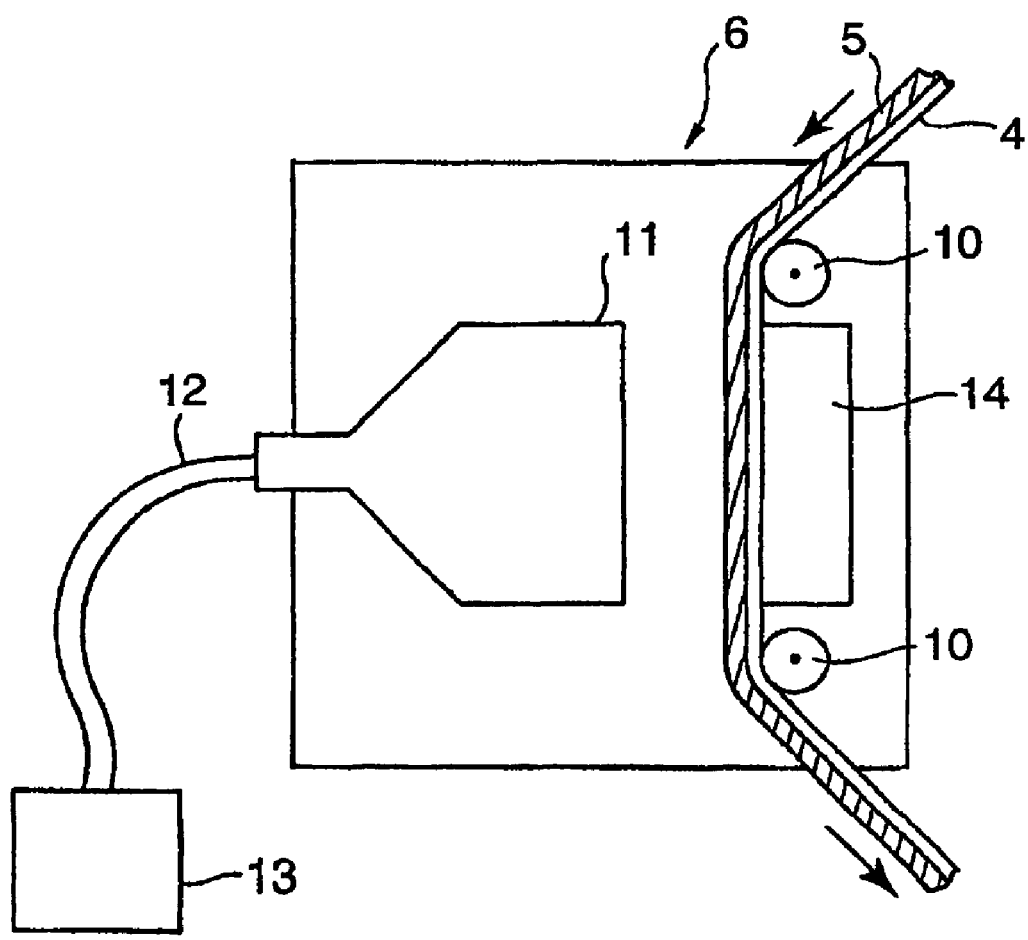
FIG. 2 is a sketch showing the constitution of the ultraviolet irradiation apparatus of the present invention.

Ultraviolet irradiation apparatus 6 is composed, for example, as shown in FIG. 2 as a means of cooling the adhesive film in this manner. FIG. 2 is an overhead view showing one mode of ultraviolet irradiation apparatus 6 used in the present invention. Reference numeral 4 represents a separator, 5 the adhesive film, 10 guide rollers, 11 an ultraviolet irradiation head, 12 an optic fiber, 13 an ultraviolet light source, and 14 a back cooling plate.

Ultraviolet light sources used in conventional ultraviolet irradiation apparatuses that emit intense light in the ultraviolet region of a wavelength of 300–400 nm can be used for ultraviolet light source 13. Examples of such light sources include a high-pressure mercury lamp, a metal halide lamp and a mercury xenon lamp. High-pressure mercury lamps and mercury xenon lamps normally emit intense light of a wavelength of 365 nm, while metal halide lamps are characterized by having high emission efficiency over a broader wavelength region than high-pressure mercury lamps as a result of sealing a metal halide, produced by halogenating mercury or a metal such as gallium or iron with iodine or bromine, in the lamp bulb.

Ultraviolet rays from this ultraviolet light source 13 are introduced to ultraviolet irradiation head 11 via optic fiber 12. The material of this optic fiber is preferably quartz glass since attenuation to minimize attenuation in the ultraviolet wavelength region.

Ultraviolet rays that have been introduced from the ultraviolet light source by this optic fiber are irradiated on adhesive film 5 from an irradiation port on the end of the ultraviolet irradiation part. This irradiation port is composed of a plurality of optic fibers wrapped in a bundle, and its shape is preferably a rectangle in order to impart uniform ultraviolet irradiation intensity in the lengthwise direction of the adhesive film normally having a width of about 2 mm. The length of this irradiation port can be adjusted by, for example, disposing a shutter or the like for adjusting irradiation length on its front surface. Practically, the length of the irradiation port is suitably from about 10 cm to 1 m. Although the width of the irradiation port varies according to the width of the adhesive film, normally a width roughly equal to a single optic fiber (0.2 mm) to about 5 mm is suitable. A converging optical lens may be disposed on the end of the irradiation port to converge ultraviolet rays onto the irradiated surface of the adhesive film.

Thus, although adhesive film 5 with separator 4 that has been unwound from reel 1 enters ultraviolet irradiation apparatus 6 being guided by a guide roller, and is irradiated for a prescribed time with ultraviolet rays from ultraviolet irradiation head 11, separator 4 is in contact with back cooling plate 14 at this time. This back cooling plate 14 absorbs the radiation heat generated in the adhesive film and separator by irradiation of ultraviolet rays, and inhibits heating of the adhesive film. Thus, it is preferably composed of a material having high thermal conductivity in the manner of a metal such as stainless steel or aluminum. In addition, cooling water may be circulated inside or behind the back cooling plate.

Moreover, although not shown in FIG. 2, this ultraviolet irradiation apparatus may also be provided with an ultraviolet sensor for measuring ultraviolet irradiation intensity (for example, a silicon photodiode sensor equipped with an ultraviolet attenuation filter), a cooling fan for discharging heat accumulating inside the irradiation apparatus, and a means for bringing the back cooling plate in close contact with the separator (for example, by blowing air onto the adhesive film to bring it in close contact using wind pressure).

Moreover, since ultraviolet rays irradiated onto the adhesive film of a particularly high energy wavelength, such as those having a wavelength of 300 nm or less, are easily adsorbed by the adhesive film and separator and converted into heat, it is preferable to dispose a light blocking filter capable of sufficiently attenuating these ultraviolet rays having a wavelength of 300 nm or less (the so-called deep UV region) on the irradiation port. In addition, a filter that attenuates visible light having a wavelength of 450 to 600 nm or a filter that absorbs infrared rays having a wavelength of 800 to 4000 nm may be disposed on the ultraviolet light source or irradiation port to inhibit the conducting of heat from the light source to the surface of the adhesive film.

In FIG. 2, although the back cooling plate is shown as being contacted with the adhesive film simultaneous to UV irradiation, the irradiation of ultraviolet rays and cooling may be carried out in separate apparatuses so that cooling is performed immediately after irradiation of ultraviolet rays. In addition, the cooling means is not necessarily limited to a back cooling plate, but rather other means such as blowing cool air with a cooling fan may also be used provided they are able to achieve sufficient cooling.

In this manner, by cooling an adhesive film either during or immediately after irradiation of ultraviolet rays onto the adhesive film, overheating of the adhesive film can be prevented, thereby preventing premature curing of the adhesive film.

In FIG. 1, if the first substrate and second substrate both have circuits thereon, the circuit can be electrically connected by using a ultraviolet activatable anisotropically conductive adhesive film as the adhesive film. The term "ultraviolet activatable anisotropically conductive adhesive film" as used herein means a film formed of an adhesive having the capability of attaining adhesion between two circuit substrates when these circuit substrates are laminated one on another and the circuits on the circuit substrates are made electrically conductive, and also capable of exerting conductivity in the thickness direction but not in the plane direction of the substrate so as not to short the adjacent circuits on the circuit substrates, namely, exerting electroconductivity upon adhering. The anisotropic conductivity is a phenomenon occurring when substrates are bonded to each other by thermo compression bonding using an adhesive film, because non-conductive adhesive components exclusive of conductive particles are fluidized by the heat and pressure during thermo compression bonding and eliminated. As a result, the circuits on two facing substrates are made electrically conductive with each other but due to the presence of non-conductive adhesive components, the conductivity is not exerted in the plane direction of the substrate.

For example, the electroconductive adhesive described in Japanese Unexamined Patent Publication No. 11-60899 uses an ultraviolet activatable cationic polymerization catalyst as the catalyst for curing an alicyclic epoxy resin, and is therefore considered to have a very short usable time following irradiation of ultraviolet rays. In the method described in the above patent publication, the thermo compression bonding is performed immediately after the irradiation of ultraviolet rays, and therefore the short usable time does not cause a problem. However, in the method of the present invention, as described above, the substrate is conveyed to a press-bonding head some time after the irradiation of ultraviolet rays, and an adhesive film having an excessively short usable time is disadvantageous. When also taking into consideration the maintenance time during the step of installing a semiconductor device during actual production or the temporary fault or the like of the production line, the usable time of the ultraviolet activatable adhesive film used in the present invention is preferably 10 minutes or more. Moreover, the ultraviolet activatable adhesive film for use in the present invention is preferably formed of an adhesive having all of the following properties: (1) the storage stability at room temperature is high, for example, the usable state can be maintained for at least 30 days, (2) the adhesive can be subjected to a relatively high temperature before the activation by ultraviolet rays, whereby the drying for the film formation can be completed within a short time and the adhesive film can be efficiently formed, (3) the adhesive can be rapidly cured at a low temperature of 100 to 130° C. at the time of thermocompression bonding after the activation by ultraviolet rays, preferably can be cured within 1 minute, more preferably within 30 seconds, and still more preferably within 10 seconds, and (4) after the substrates are connected to each other, excellent connection stability can be exhibited.

This preferred ultraviolet activatable adhesive may be, for example, an adhesive comprising as essential components an epoxy resin containing (1) alicyclic epoxy resin and (2) glycidyl group-containing epoxy resin, (3) an ultraviolet activation cationic polymerization catalyst, and (4) a cationic polymerization inhibitor. By using this adhesive, the above-described properties can be obtained in good balance. In order to form a film from this preferred ultraviolet activatable anisotropically conductive adhesive, a thermoplastic elastomer or a resin is added. An ultraviolet activatable anisotropically conductive adhesive can be obtained by adding conductive particles into the ultraviolet activatable adhesive.

The alicyclic epoxy resin has an action of enabling rapid curing at a low temperature when combined with an ultraviolet activatable cationic polymerization catalyst. The glycidyl group-containing epoxy resin has an action of prolonging the usable time of the adhesive film after the activation by ultraviolet rays together with the cationic polymerization inhibitor, and its reactivity is lower than that of the alicyclic epoxy resin and brought out in the slightly high temperature region. The ultraviolet activatable cationic polymerization inhibitor is a compound that produces a Lewis acid or the like as a cationic active seed upon irradiation of ultraviolet rays, and catalyzes the epoxy ring-opening reaction. The cationic polymerization inhibitor suppresses or inhibits the cationic polymerization reaction by displacing a part of the cationic polymerization catalyst and also by trapping a Lewis acid and the like which serve as a cationic active seed in the cationic polymerization, thereby prolonging the usable time of the adhesive film.

In order to attain good electrical connection between a substrate and another substrate using an ultraviolet activatable adhesive film, it is necessary that the adhesive component is fully fluidized by the heat and pressure during thermo compression bonding, and that the non-conductive adhesive component be satisfactorily eliminated between the conductive particles and the circuit on the circuit substrate. The fluidity of the adhesive component varies depending on the intrinsic viscosity of the resin in the adhesive and the elevation of the viscosity accompanying the heat-curing reaction which proceeds gradually. If the composition contains the alicyclic epoxy resin as the epoxy resin and contains the ultraviolet activatable cationic polymerization catalyst, it cannot act as a catalyst before the activation by ultraviolet rays. Therefore, high storability at room temperature and the capability of maintaining the usable state for at least 30 days are ensured. However, after the activation by ultraviolet rays, the composition is heat-cured at a low temperature within a short period of time. Since the heat-curing reaction proceeds rapidly after the activation and the viscosity elevates within a short period of time due to the heat-curing reaction, the thermo compression bonding must be performed quickly. In order to delay this curing reaction, it may be considered to add a cationic polymerization inhibitor. However, even in the case where such an inhibitor is added, if a long time elapses after irradiation of ultraviolet rays until the thermo compression bonding, for example, by taking time in the step of aligning the circuit substrates with each other, the adhesive component between the electro conductive particles and the circuit on the circuit substrate cannot be satisfactorily eliminated due to the increase of viscosity of the adhesive component accompanying the heat-curing reaction which proceeds gradually, and the electrical connection is therefore liable to be unstable. If the composition contains the glycidyl group-containing epoxy resin as the epoxy resin, the heat-curing reaction after the irradiation of ultraviolet rays proceeds relatively slowly. Therefore, although the usable time after activation can be prolonged, in order to attain satisfactory curing and thereby ensure good electrical connection, it is necessary either to elevate the press-bonding temperature or prolong the press-bonding time.

The increase in viscosity of an anisotropically conductive adhesive film obtained from an anisotropically conductive adhesive comprising all of an epoxy resin containing both alicyclic epoxy resin and glycidyl group-containing epoxy resin, an ultraviolet activatable cationic polymerization catalyst and a cationic polymerization inhibitor, is reduced after the irradiation of ultraviolet rays due to the effect of the glycidyl group-containing epoxy resin and the cationic polymerization inhibitor. Therefore, the usable time after activation can be prolonged, and at the same time, by virtue of the high reactivity of the alicyclic epoxy resin owing to the combination of the alicyclic epoxy resin with the ultraviolet activatable cationic polymerization catalyst, this film can be satisfactorily cured even at a low temperature, thereby ensuring stable electrical connection.

Thus, this ultraviolet activatable adhesive film is advantageous in that (1) the curing reaction does not proceed before the activation by ultraviolet rays and the storage stability at room temperature is high, (2) a relatively high temperature can be set before the activation (because the curing reaction does not proceed even at 80° C.), so that the drying for the film formation can be completed within a short time and therefore, the adhesive film can be manufactured with high efficiency (within a short time) as compared with conventional adhesive films, (3) after the activation by ultraviolet rays, the usable time at an ordinary temperature can preferably be prolonged to 10 minutes or more, so that the press-bonding operation can be performed satisfactorily, (4) in attaining the electrical connection by bonding a material which readily deforms by heat, for example, a circuit substrate made of FPC or TAB based on a polymer material such as polyester or polyimide, or PCB, polycarbonate or polyethersulfone based on a glass-reinforced epoxy material, the deformation of the material can be reduced to the minimum by performing the thermo compression bonding rapidly (preferably within 1 minute, more preferably within 30 seconds, and still more preferably within 10 seconds) at a low temperature on the order of 100 to 130° C., and (5) after the connection of substrates to each other, excellent interconnection is exhibited.

The components constituting the preferred ultraviolet activatable adhesive film are individually described below.

Alicyclic Epoxy Resin

As mentioned above, the alicyclic epoxy resin improves the rapid curability and low temperature curability of the adhesive composition. The combination of this component with the ultraviolet activatable cationic polymerization catalyst allows rapid curing at low temperature. Because of the low viscosity, it also acts to increase close contact between the composition and the substrate. The alicyclic epoxy resin is an epoxy resin with an average of at least two alicyclic epoxy groups per molecule. As examples of alicyclic epoxy resins there may be mentioned the following that have two epoxy groups in the molecule: vinylcyclohexene dioxide, 3,4-epoxycyclohexylmethyl-3,4-epoxycyclohexanecarboxylate, bis(3,4-epoxycyclohexyl)adipate, 2-(3,4-epoxycyclohexyl-5,5-spiro-3,4-epoxy)cyclohexane-metadioxane and their combinations. Polyfunctional alicyclic epoxy resins having 3, 4 or more epoxy groups in the molecule (for example, Epolide GT: available from Daicel Chemical Industries, Ltd.) may also be used.

The alicyclic epoxy resin has epoxy equivalents in the range of usually 90–500, preferably 100–400, more preferably 120–300, and most preferably 210–235. With fewer than 90 epoxy equivalents, the toughness after thermosetting is reduced and the adhesive strength is lower, which may reduce the connection reliability. With more than 500 epoxy equivalents, the viscosity of the entire system is excessively increased, the flow properties are poor during thermocompression bonding or the reactivity is lowered such that the connection reliability may be reduced.

Glycidyl Group-Containing Epoxy Resin

As mentioned above, with an action of a cationic polymerization inhibitor, the glycidyl group-containing epoxy resin has the function of prolonging the usable time of the composition after ultraviolet activation, and it has lower reactivity than the alicyclic epoxy resin while having a reactivity in a slightly higher temperature range. When using an adhesive film containing only the alicyclic epoxy resin with no glycidyl group-containing epoxy resin, the curing reaction tends to proceed even at lower temperatures near room temperature, presenting the drawback of shorter usable time after activation by ultraviolet irradiation. Thus, as explained above, when the time until thermocompression bonding is extended by the time required for alignment of the circuit substrates and so forth, the viscosity increase of the composition due to the thermosetting reaction prevents adequate elimination of the adhesive components between the conductive particles and the conductor on each circuit substrate, thereby tending to result in an unstable electrical connection. The glycidyl group-containing epoxy resin compensates for this drawback of such alicyclic epoxy resins. The glycidyl group-containing epoxy resin used is an epoxy resin with an average of at least two glycidyl groups in the molecule. As examples of glycidyl group-containing epoxy resins, there may be mentioned bisphenol A-type epoxy resins synthesized from bisphenol A and epichlorohydrin, low-viscosity bisphenol F-type epoxy resins, polyfunctional phenol-novolak epoxy resins, ortho-cresol epoxy resins and their combinations. Glycidyl ester-type epoxy resins such as glycidyl hexahydrophthalate ester may also be used. However, they are limited to epoxy resins having no cationic polymerization-inhibiting groups, such as amines or sulfur- or phosphorous-containing groups.

The glycidyl group-containing epoxy resin has epoxy equivalents in the range of usually 170–5500, preferably 170–1000, more preferably 170–500 and most preferably 175–210. With fewer than 170 epoxy equivalents, the toughness after thermosetting may be reduced and the adhesive strength lowered. With more than 5500 epoxy equivalents, the viscosity of the entire system is excessively increased, the flow properties are poor during thermocompression bonding or the reactivity is lowered, such that the connection reliability may be reduced.

Mixing Ratio for Alicyclic Epoxy Resin and Glycidyl Group-Containing Epoxy Resin The alicyclic epoxy resin and glycidyl group-containing epoxy resin provide a satisfactory balance for the properties of the composition. Specifically, it is possible to provide an adhesive satisfactorily exhibiting both the low-temperature rapid curability of the alicyclic epoxy resin and the long shelf life at room temperature of the glycidyl group-containing epoxy resin. The alicyclic epoxy resin/glycidyl group-containing epoxy resin weight ratio is usually 20:80 to 98:2, preferably 40:60 to 94:6, more preferably 50:50 to 90:10 and most preferably 50:50 to 80:20. If the amount of the alicyclic epoxy resin is less than 20% based on the total amount of the alicyclic epoxy resin and the glycidyl group-containing epoxy resin, the curing properties at low temperature may be reduced and the adhesive strength and connection reliability may be inadequate. If the amount of the alicyclic epoxy resin is greater than 98%, the curing reaction may be promoted even at near room temperature, thus shortening the usable time after ultraviolet irradiation.

Ultraviolet Activatable Cationic Polymerization Catalyst

The ultraviolet activatable cationic polymerization catalyst is a compound that catalyzes an epoxy ring-opening reaction by producing a cationic active species such as a Lewis acid by ultraviolet irradiation. As examples of such polymerization catalysts that may be mentioned aryldiazonium salts, diaryliodonium salts, triaryldiazonium salts, triarylselenium salts, iron-arene complexes, and the like. Iron-arene complexes are particularly preferred because of their thermal stability, and specifically there may be mentioned xylene-cyclopentadienyl iron (II) hexafluoroantimonate, cumene-cyclopentadienyl iron (II) hexafluorophosphate and xylene-cyclopentadienyl iron (II)-tris(trifluoromethylsulfonyl)methide.

The ultraviolet activatable cationic polymerization catalyst is used at usually 0.05–10.0 parts by weight, preferably 0.075–7.0 parts by weight, more preferably 0.1–4.0 parts by weight and most preferably 1.0–2.5 parts by weight, with respect to 100 parts by weight of the epoxy resin. If the amount if smaller than 0.05 parts by weight, the curing properties at low temperature may be reduced and the adhesive strength and connection reliability may be inadequate. If the amount is greater than 10.0 parts by weight, the curing reaction may be promoted even at near room temperature, and the shelf life at room temperature may be reduced.

Cationic Polymerization Inhibitor

The cationic polymerization inhibitor delays or inhibits the cationic polymerization reaction by substituting a part of the cationic polymerization catalyst and by sequestering the Lewis acid or other cationic active species in the cationic polymerization. Specifically there may be mentioned crown ethers such as 15-crown-5, 1,10-phenanthroline and its derivatives, toluidines such as N,N-diethyl-meta-toluidine, phosphines such as triphenylphosphine, and triazines, etc.

The cationic polymerization inhibitor is used at usually 0.01–10.0 equivalents, preferably 0.05–5.0 equivalents, more preferably 0.10–3.0 equivalents and most preferably 0.4–2.0 equivalents, with respect to the ultraviolet activatable cationic polymerization catalyst. If the cationic polymerization inhibitor is present at greater than 10.0 equivalents, the curing properties at low temperature may be reduced and the adhesive strength and connection reliability may be inadequate, while if it is present at less than 0.05 equivalents, the curing reaction may be promoted even at near room temperature, and the shelf life at room temperature may therefore be reduced.

Conductive Particles

The conductive particles used may be conductive particles such as carbon particles or metal particles of silver, copper, nickel, gold, tin, zinc, platinum, palladium, iron, tungsten, molybdenum, solder of the like, or particles prepared by covering the surface of these particles with a conductive coating of a metal or the like. It is also possible to use non-conductive particles of a polymer such as polyethylene, polystyrene, phenol resin, epoxy resin, acryl resin or benzoguanamine resin, or glass beads, silica, graphite or a ceramic, whose surfaces have been covered with a conductive coating or a metal or the like.

Although there are no particular restrictions on the shape of the conductive particles used, it is usually preferable that they be nearly spherical, and even if the surface of the particles has a certain degree of irregularities or spikes, the conductive particles can still be applied. In addition, the conductive particles may also be in the shape of ovals or rods. The mean particle size of the conductive particles may vary depending on the electrode width and the spacing between the adjacent electrodes used for connection. For example, if the electrode width is 50 $\mu$m and the spacing between adjacent electrodes is 50 $\mu$m (i.e., the electrode pitch is 100 $\mu$m), a mean particle size of about 3 to 20 $\mu$m is appropriate. By using an anisotropically conductive adhesive film in which are dispersed conductive particles with a mean particle size in this range, it is possible to achieve fully satisfactory conductive characteristics while also adequately preventing short circuiting between adjacent electrodes. In most cases, since the pitch of the electrodes used for connection between the two circuit substrates will be from 50 to 1000 $\mu$m, the mean particle size of the conductive particles is preferably in the range of 2 to 40 $\mu$m. If they are smaller than 2 $\mu$m, they may be buried in pits in the electrode surface thus losing their function as conductive particles, and if they are larger than 40 $\mu$m, they may tend to produce short circuiting between adjacent electrodes.

The amount of the conductive particles added may vary depending on the area of the electrodes used and the mean particle size of the conductive particles. A satisfactory connection can usually be achieved with a few (for example, 2–10) conductive particles present per electrode. For even lower electrical resistance, the conductive particles may be included in the composition at 10–300 per electrode. If a high pressure is to be applied for the thermo compression bonding, the number of conductive particles on each electrode may be increased to 300–1000, and the pressure may be evenly distributed to achieve a satisfactory connection. The amount of conductive particles with respect to the total volume of the composition minus the conductive particles is usually 0.1–30% by volume, preferably 0.5–10% by volume and more preferably 1–5% by volume. If the amount is less than 0.1% by volume, there may be a greater probability of the conductive particles being absent on the electrode when connected, thus increasing the risk of lower connection reliability. If the amount is greater than 30% by volume, short circuiting between adjacent electrodes may tend to occur.

Thermoplastic Elastomer or Resin

The thermoplastic elastomer or resin is a component that is preferably included when the ultraviolet activatable adhesive is to be used as an adhesive film. The thermoplastic elastomer or resin increases the film formability of the adhesive film while also enhancing the impact resistance of the resulting adhesive film and alleviating residual internal stress produced by the curing reaction, for improved bond reliability. The type of polymer compound commonly known as a thermoplastic elastomer is composed of a hard segment which is a confined phase at below a certain temperature and a soft segment that expresses rubber elasticity. Such elastomers include styrene-based thermoplastic elastomers, styrene-based elastomers which are block copolymers including, for example, a styrene unit in the hard segment and a polybutadiene unit or polyisoprene unit in the soft segment. As typical examples there may be mentioned styrene-butadiene-styrene block copolymer (SBS), styrene-isoprene-styrene block copolymer (SIS), as well as styrene-(ethylene-butylene)-styrene block copolymer (SEBS), wherein the diene component in the soft segment is hydrogenated, styrene-(ethylene-propylene)-styrene block copolymer (SEPS) and their combinations. There may also be used styrene-based thermoplastic elastomers with reactive groups, such as elastomers of the type which are epoxy-modified by glycidyl methacrylate, or elastomers of the type in which the unsaturated bond of a conjugated diene is epoxidized. With such elastomers having reactive groups, the high polarity of the reactive groups increases the compatibility with the epoxy resin so that the range of formulation with epoxy resins is widened, while its incorporation into a crosslinked structure by crosslinking reaction with the epoxy resin can improve the bonding reliability after curing due to the resistance to heat and humidity. An example of an epoxidized styrene-based elastomer is Epofriend A1020 (Daicel Chemical Industries, Ltd.). In the present invention, a thermoplastic resin may also be used instead of a thermoplastic elastomer. Because the thermoplastic resin must be eliminated by fluidization during thermo compression bonding of the adhesive film in order to ensure a satisfactory electrical connection between the conductors on the bonded substrate, it is limited to a resin with a Tg, of no higher than the thermo compression bonding temperature (for example, 100–130° C.). Examples of such resins include polystyrene resins, phenoxy resins and their combinations.

The thermoplastic elastomer or resin is used usually at 10–900 parts by weight, preferably 20–500 parts by weight, more preferably 30–200 parts by weight and most preferably 40–100 parts by weight with respect to 100 parts by weight of the epoxy resin. If added at less than 10 parts by weight, the film formability of the adhesive may be reduced, and if added at greater than 900 parts by weight, the flow properties of the adhesive as a whole at low temperature may be reduced to the point of poor contact when the conductive particles and the circuit substrate are bonded, and may result in increased electrical resistance or lower connection reliability, and sometimes lower bonding strength.

Other Additives

The ultraviolet activatable adhesive film used in the present invention may also contain an added cationic polymerization reaction accelerator in addition to the components mentioned above. Addition of a reaction accelerator can further improve the low temperature curability and rapid curing property. An example of such a reaction accelerator is di-tert-butyloxalate. The reaction accelerator is added in an amount in the range of usually 0.01–5 parts by weight, preferably 0.05–3 parts by weight and more preferably 0.1–2 parts by weight with respect to 100 parts by weight of the alicyclic epoxy resin and glycidyl group-containing epoxy resin. For increased bonding between the circuit substrate and the adhesive composition, there may also be included a coupling agent, for example a silane coupling agent such as γ-glycidoxypropyltrimethoxysilane, and β-(3,4-epoxycyclohexyl)ethyl trimethoxysilane.

Moreover, other additives such as antioxidants (for example, hindered phenol-based antioxidants), diols (for example, bis(phenoxyethanol)fluorene), chain transfer agents, sensitizers (for example, anthracene), tackifiers, thermoplastic resins (for example, polyvinylacetal, polybutyral, acryl resin and their combinations), fillers such as silica, flow modifiers, plasticizers, antifoaming agents and the like may also be added so long as the effect of the invention is not impeded.

Separator

The ultraviolet activatable adhesive composition containing the components described above is coated on a separator and dried to form an adhesive film. The formed ultraviolet activatable adhesive film is preferably protected from irradiation of unnecessary ultraviolet rays as much as possible before the film is irradiated with ultraviolet rays. Accordingly, although the separator may be a film obtained by forming a resin such as nylon, polyester, polypropylene, acryl-based resin, polycarbonate, vinyl resin, polyethylene and polyimide, this film used as the separator is preferably imparted with a function of reducing the ultraviolet transmission factor by kneading in an ultraviolet absorber, and has a release layer formed of a silicone-based or fluorine-based release agent on one surface or both surfaces thereof.

The ultraviolet transmission factor is preferably 10% or less at a wavelength of 300 to 400 nm. Examples of the method for reducing the ultraviolet transmission factor of the separator include a method of kneading an ultraviolet absorbing component such as carbon into the film itself, a method of coating an ink containing an ultraviolet absorbing component on the film surface, and a method of forming a film of a metal such as aluminum or nickel on the film surface by metallization or the like. The separator may be provided not only on one surface, but also on both surfaces of the adhesive film.

Method for Production of Ultraviolet Activatable Adhesive Film

The ultraviolet activatable adhesive film may be obtained by preparing a coating solution containing the aforementioned ultraviolet activatable adhesive composition in an appropriate organic solvent such as tetrahydrofuran (THF) or methyl ethyl ketone (MEK), using appropriate coating means such as a knife coater or the like to coat it onto a separator such as a polymer film, and then drying the coated film. The drying is carried out at a low temperature at which the solvent evaporates. However, the adhesive is stable without undergoing curing reaction even at higher temperatures of about 80° C. Consequently, the drying may be carried out under increasing temperature so long as the curing reaction is not promoted, and this can improve working efficiency. The thickness of the formed adhesive film is 5–100 μm in order to avoid gaps between connections when the circuit substrates are connected together by thermocompression bonding, and to allow the necessary and sufficient packing.

Although the adhesive film produced in the manner described above is irradiated with ultraviolet rays by the ultraviolet irradiation apparatus shown in FIG. 2, the irradiation dose of ultraviolet rays is usually 100 to 10,000 mJ/cm$^2$, which is the dose sufficient for activation of the ultraviolet activatable cationic polymerization catalyst in the ultraviolet activatable adhesive film.

As shown in FIG. 1, the thus activated ultraviolet activatable adhesive film is transferred to a first circuit substrate by a press-bonding head, and then a second circuit substrate is disposed on the adhesive film and thermocompression bonded by a press-bonding head. The temperature during thermocompression bonding is preferably 100–130° C., and the bonding pressure is appropriately selected so as to achieve adequate electrical connection after bonding. The pressure applied is usually in the range of 1 to 5 MPa. A bonding time of about 10 seconds is usually sufficient, but there is usually no problem in terms of adhesive performance even with a bonding time of one minute or longer.

The present invention will now be explained in further detail by way of the following non-limiting examples.

EXAMPLES

Measurement of Film Temperature

Figure 3:
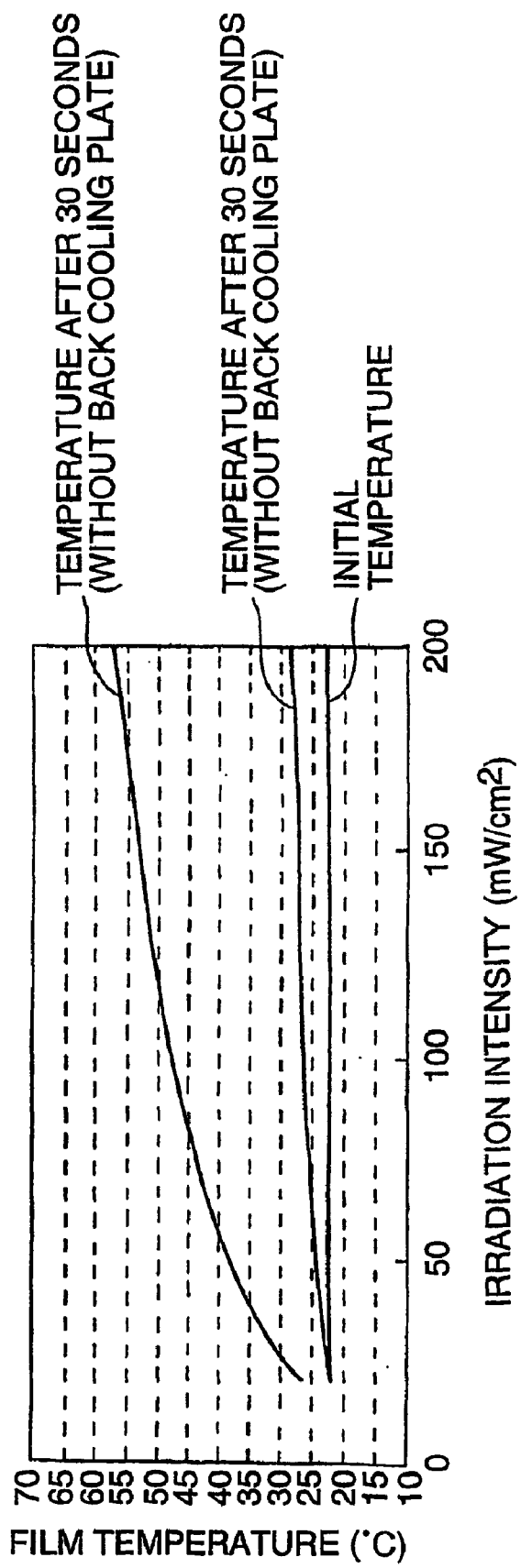
FIG. 3 is a graph showing the change in temperature during irradiation of ultraviolet rays onto an adhesive film.

An ultraviolet irradiation apparatus equipped with a mercury xenon lamp (central wavelength: 365 nm) for the ultraviolet light source was used composed of an irradiation head having an irradiation port measuring 0.75 mm wide× 150 mm long connected from the ultraviolet light source with a quartz fiber. Using an ultraviolet irradiation apparatus as shown in FIG. 2, a polyester film having a thickness of 50 μm and containing carbon was disposed at a distance of 10 mm from the end of the irradiation port, and the surface temperature of this film was measured 30 seconds after the start of ultraviolet irradiation both for the case of not disposing a stainless steel back cooling plate behind this film, and the case of not disposing such a cooling plate. Those results are shown in FIG. 3. Although the temperature elevation after 30 seconds is large in the case of not disposing a back cooling plate, in the case of having disposed a back cooling plate, the attainable temperature was no higher than 30° C. even when the irradiation intensity was 200 mW/cm$^2$, and temperature elevation was able to be inhibited.

Measurement of Uniformity of Ultraviolet Irradiation Intensity

The uniformity of ultraviolet rays irradiated onto the film was investigated while holding an ultraviolet dosimeter at a location at a distance 1 cm from the irradiation port of the above-mentioned ultraviolet irradiation apparatus. According to those results, the intensity of the ultraviolet rays irradiated onto the entire film were uniform as shown in FIG. 4.

Preparation of Ultraviolet Activatable Anisotropically Conductive Adhesive Film

After mixing 4.1 g of alicyclic epoxy resin (Cylacure UVR6128, product name of Union Carbide Japan Ltd., epoxy equivalents=200), 0.5 g of alicyclic epoxy resin (Cylacure UVR6105, product name of Union Carbide Japan Ltd., epoxy equivalents=133), 1.2 g of phenol-novolak epoxy resin (Epikote 154, product name of Yuka Shell Epoxy Ltd., epoxy equivalents=178), 0.20 g of bis (phenoxyethanol)fluorene and 4.0 g of phenoxy resin (Payfen PKHC, product name of Phenoxy Associates Ltd.) with 10 g of tetrahydrofuran, the mixture was stirred to uniformity. The conductive particles (gold-plated acryl resin with a nickel undercoating, mean particle size=5 μm) were added in an amount of 3% by volume of a final solid, and stirring was continued until the conductive particles were thoroughly dispersed to obtain a dispersion. Separately, 0.060 g of xylene-cyclopentadienyl iron (II)-tris (trifluoromethylsulfonyl)methide, 0.016 g of N,N-diethyl-m-toluidine, 0.04 g of di-tert-butyloxalate, 0.2 g of silane coupling agent (A187, product name of Nippon Unicar Co., Ltd., γ-glycidoxypropyltrimethoxysilane) and 0.6 g of methyl ethyl ketone were mixed and stirred to uniformity, and this mixture was added to and stirred with the aforementioned dispersion to obtain an ultraviolet activatable anisotropically conductive adhesive. This adhesive was coated onto a silicone-treated polyester film (separator) using a knife coater, and dried for 10 minutes at 60° C. to obtain an ultraviolet activatable anisotropically conductive adhesive film with a thickness of 20 μm.

Fabrication of Connection Test Strip for Circuit Substrate

Ultraviolet light having intensity of 100 mW/cm$^2$ or 25 mW/cm$^2$ was irradiated for 30 seconds onto the ultraviolet activatable anisotropically conductive adhesive film of 2 mm in width produced in the above manner by using an ultraviolet irradiation apparatus similar to that described above. Next, the ultraviolet activatable anisotropically conductive adhesive film previously irradiated with ultraviolet rays was tacked onto a 0.7 mm thick glass substrate having an ITO (Indium Tin Oxide) film on the surface and thermocompression bonded at 30° C. and 1 MPa for 3 seconds followed by removal of the separator (pre-bonding). Next, a flexible printed circuit composed with gold-plate copper traces having a conductor width of 35 μm and thickness of 12 μm on a 25 μm thick polyimide film at a conductor pitch of 70 μm was positioned on the above pre-bonded ultraviolet activatable anisotropically conductive adhesive film and anchored in position. The portion of the ultraviolet activatable anisotropically conductive adhesive film was then thermocompression bonded at 120° C. and 1.0 MPa for 10 seconds to obtain connection test strips for circuit substrates (bonding).

Evaluation

Connection resistance, 90 degree peel adhesion strength and deformation of the conductive particles were investigated immediately after ultraviolet irradiation and during bonding after a predetermined amount of time had elapsed in the connection test strips for circuit substrates fabricated in the manner described above. Those results are shown in the following Table 1. Furthermore, the judgment criteria used in Table 1 are shown in Table 2.

TABLE 1

| | Exp. No. | | | | | | | | | | | |
|---|---|---|---|---|---|---|---|---|---|---|---|---|
| | EX1 | EX2 | EX3 | CE1 | CE2 | CE3 | EX4 | EX5 | EX6 | CE4 | CE5 | CE6 |
| UV irradiation intensity (irradiation time = 30 seconds) | 100 mW/cm² | | | | | | 25 mW/cm² | | | | | |
| Back cooling plate | Present | | | Absent | | | Present | | | Absent | | |
| Time until bonding after UV irradiation | Imm. after | 5 min. | 20 min. | Imm. after | 5 min. | 20 min. | Imm. after | 5 min. | 20 min. | Imm. after | 5 min. | 20 min. |
| Connection resistance | ■ | ■ | ■ | ■ | ■ | ■ | ■ | ■ | ■ | ■ | ■ | ■ |
| Mean peel adhesive strength | ■ | ■ | ■ | ■ | ■ | X | ■ | ■ | ■ | ■ | ■ | ■ |
| Degree of particle deformation | ■ | ■ | ■ | ⑧ | ⑧ | ⑧ | ■ | ■ | ■ | ■ | ■ | |
| Overall evaluation | Ex. | Ex. | Ex. | Good | Good | NG | Ex. | Ex. | Ex. | Ex. | Ex. | Good |

EX: Example of the present invention
CE: Comparative example

TABLE 2

| Evaluation criteria | ■ | ⑧ | X |
|---|---|---|---|
| Connection resistance | All terminals 100 ■ or less | — | At least one terminal of 100 Ω or more |
| Peel adhesive strength | 400 N/m or more | — | Less than 400 N/m |
| Degree of particle deformation | Particles deformed flat | Mixture of flat and spherical particles | Particles remain spherical and are not deformed |

Circuit connection is satisfactory and resistance values are stable and low when the conductive particles are deformed so that they are pressed flat. Although usable time of 20 minutes was confirmed at an ultraviolet irradiation intensity of 25 mW/cm² in the case of not using a back cooling plate in the ultraviolet irradiation apparatus, when the ultraviolet irradiation intensity was 100 mW/cm², peel adhesive strength decreased and the usable time was less than 20 minutes. In contrast, in the case of using a back cooling plate, both connection resistance and peel adhesive strength were satisfactory over a broad range of ultraviolet irradiation intensity of 25–100 mW/cm², and usable times of at least 20 minutes were obtained.

In accordance with the present invention, overheating of the adhesive film and separator due to irradiation of ultraviolet rays can be prevented, as a result the allowable range of the intensity of the irradiated ultraviolet rays is widened, stable adhesive strength is obtained at all times, and the usable time of the adhesive film can be prolonged.

What is claimed is:

1. A method for adhering two substrates comprising the sequential steps of:
    Providing an adhesive film having a first surface and a second surface;
    Irradiating the adhesive film with ultraviolet radiation to provide an activated adhesive film having a first activated surface and a second activated surface;
    Cooling the activated adhesive film either while irradiating the film;
    Contacting the first activated surface with a first substrate;
    Contacting the second activated surface with a second substrate; and
    Applying heat and pressure to the first and second substrates to cure the activated adhesive film and bond the substrates to one another.

2. The method of claim 1 wherein the adhesive film is an ultraviolet activatable anisotropically conductive adhesive film comprising conductive particles.

3. The method of claim 1 wherein the activated adhesive film has a usable time following the irradiating of the adhesive film of at least 10 minutes.

4. The method of claim 1 wherein the applying heat and pressure comprises heating the first and second substrates to a bonding temperature between 100 to 130° C. for 60 seconds.

5. The method of claim 1 wherein the adhesive film is an epoxy resin comprising an alicyclic epoxy resin and a glycidyl containing epoxy resin, an ultraviolet activatable cationic polymerization catalyst, a cationic polymerization inhibitor, and conductive particles.

* * * * *